United States Patent [19]

Norsworthy et al.

[11] Patent Number: 5,424,739

[45] Date of Patent: Jun. 13, 1995

[54] DEVICE AND METHOD FOR DIGITALLY SHAPING THE QUANTIZATION NOISE OF AN N-BIT DIGITAL SIGNAL, SUCH AS FOR DIGITAL-TO-ANALOG CONVERSION

[75] Inventors: Steven R. Norsworthy, Emmaus, Pa.; Rich: David A., Woodmere, N.Y.; Thayamkulangara R. Viswanathan, Albany Township, Berks County, Pa.

[73] Assignee: AT&T Corp., Murray Hill, N.J.

[21] Appl. No.: 171,485

[22] Filed: Dec. 21, 1993

[51] Int. Cl.$^6$ ............................................. H03M 3/00
[52] U.S. Cl. ..................................... 341/143; 341/144
[58] Field of Search ............... 341/143, 144, 145, 155, 341/156; 375/26, 27, 28

[56] References Cited

U.S. PATENT DOCUMENTS

| | | | |
|---|---|---|---|
| 4,467,316 | 8/1984 | Musmann | 340/347 DA |
| 4,593,271 | 6/1986 | Candy | 340/347 |
| 5,144,308 | 9/1992 | Norsworthy | 341/131 |

OTHER PUBLICATIONS

"A 16-bit 4'th Order Noise–Shaping D/A Converter" by L. Richard Carley and John Kenney, Department of Electrical and Computer Engineering, Reprinted from IEEE Proc. CICC, pp. 21.7.1–21.7.4, 1988, reprint pp. 482–485.

"Oversampled, Linear Predictive and Noise–Shaping Coders of Order N>1", by Stuart K. Tewksbury, Member IEEE, and Robert W. Hallock, pp. 139–149, IEEE Transactions on Circuits and Systems, vol. Cas-25, No. 7, Jul. 1978.

"Philips Oversampling System for Compact Disc Decoding", Wayne Schott, N.A.P. Consumer Electronics, Knoxville, Tenn., pp. 32–35, Audio/Apr. 1984.

Primary Examiner—Brian K. Young
Attorney, Agent, or Firm—Howard A. Skaist

[57] ABSTRACT

A device for digitally shaping the quantization noise of an N-bit digital signal, N being a positive integer, comprises: a register for masking out selected bits of the N-bit digital signal to produce an M-bit digital signal, M being a positive integer less than N; a digital noise-shaping coder, coupled to the register, for shaping the quantization noise of the masked out bits; and an accumulator, coupled to the register and the coder, for accumulating the digital signals received from the register and the coder. Likewise, a method of digitally shaping the quantization noise of an N-bit digital signal, N being a positive integer, comprises the steps of: masking selected bits of an N-bit digital signal to produce an M-bit digital signal, M being a positive integer less than N; digitally coding the masked bits of the N-bit digital signal to produce a B-bit digital signal, B being a positive integer less than N-M; and accumulating the M-bit digital signal and the B-bit digital signal.

18 Claims, 2 Drawing Sheets

DEVICE AND METHOD FOR DIGITALLY SHAPING THE QUANTIZATION NOISE OF AN N-BIT DIGITAL SIGNAL, SUCH AS FOR DIGITAL-TO-ANALOG CONVERSION

TECHNICAL FIELD

This invention relates to shaping the quantization noise of a digital signal, such as may be accomplished, for example, during digital-to-analog conversion.

BACKGROUND OF THE INVENTION

Digital-to-analog conversion, which may include oversampling or shaping the quantization noise of a digital signal, is well-known and has a wide variety of applications, including digital audio, digital telephony, and digital instrumentation, to name only a few. Digital-to-analog conversion is discussed, for example, in "Oversampling Methods for A/D and D/A Conversion," by James C. Candy and Gabor C. Temes, appearing in the text *Oversampling Delta-Sigma Data Converters: Theory, Design and Simulation*, edited by James C. Candy and Gabor C. Temes, and published by IEEE Press (1992), "Oversampled, Linear Predictive and Noise-Shaping Coders of Order N>1," by Stuart K. Tewksbury and Robert W. Hallock, and appearing in the aforementioned Candy and Temes text, "Optimal Nonrecursive Noise Shaping Filters for Oversampling Data Converters, Part 1: Theory" and "Optimal Nonrecursive Noise Shaping Filters for Oversampling Data Converters, Part 2: Applications" by Steven R. Norsworthy, appearing in IEEE Proc. ISCAS '93, Vol. 2, pp 1353–1360, May 1993, all of the foregoing herein incorporated by reference. One conversion technique, described in "A 16-bit Fourth Order Noise-Shaping D/A Converter," by L. R. Candy and John Kenney, also appearing in the Candy and Temes text, includes coupling a sigma-delta modulator to a conventional digital-to-analog converter, which is then followed by a lowpass analog filter. It will be appreciated that the terms delta-sigma modulator and sigma-delta modulator are generally used interchangeably in this context. The digital-to-analog conversion technique of the Carley and Kenney paper relaxes the constraints on the lowpass analog filter and reduces the amount of out-of-band noise present in the signal provided to the lowpass analog filter where a multibit sigma-delta modulator is used. However, the problems associated with achieving precise quantization level conversion in the conventional digital-to-analog converter coupled to the multibit sigma-delta modulator are well-known. Furthermore, all N-bits of an N-bit digital signal must be processed in the architecture of the Carley and Kenney paper. This large data path, thus, introduces some significant hardware complexity for the sigma-delta modulator.

Another approach or technique is employed in the Burr-Brown PCM67 Digital-to-Analog (D/A) Converter chip described on pages 6.2.189–6.2.192 of the Burr-Brown IC Databook Supplement, Vol. 33c, herein incorporated by reference. This chip uses a 10-bit conventional digital-to-analog converter (DAC) for the upper or most significant 10 bits of an 18-bit digital input signal. It also uses a 1-bit first-order sigma-delta modulator for the lower or least significant 8 bits of the 18-bit digital input signal. The sigma-delta modulator employs oversampling at 384 times the Nyquist rate, producing a 1-bit digital signal that is provided to a 1-bit DAC. The analog output currents from the 10-bit DAC and the 1-bit DAC are then summed to provide the analog output signal for the chip.

The "Burr-Brown" approach, although reducing the problems associated with quantization level conversion of the output signal of a conventional multibit sigma-delta modulator, has other disadvantages. In particular, the accuracy of the analog output signal produced is limited by the accuracy of combining the analog output currents from the two DACs. In addition, any direct current (DC) offset, slew rate limiting, thermal noise and other analog device anomalies will result in imperfect cancellation of the truncation error that occurs when the 18-bit digital input signal is truncated to provide the 10-bit digital signal for the 10-bit DAC. Furthermore, the truncation error fed to the 1-bit first-order sigma-delta modulator may overload its 1-bit quantizer, resulting in nonlinearities that may not be easily removed. This problem may be even worse for a sigma-delta modulator having an order higher than first order. This situation may, therefore, ultimately degrade the noise floor of the digital output signal produced by the 1-bit sigma-delta modulator. Furthermore, as is well-known, a 1-bit first-order sigma-delta modulator introduces significant pattern noise in its output signal. Thus, a need exists for a device or method for digitally shaping the quantization noise of a N-bit digital signal, such as for use in digital-to-analog conversion, that reduces or diminishes the foregoing problems.

SUMMARY OF THE INVENTION

Briefly, in accordance with one embodiment of the invention, a device for digitally shaping the quantization noise of an N-bit digital signal, N being a positive integer, comprises: a register for masking out selected bits of the N-bit digital signal to produce an M-bit digital signal, M being a positive integer less than N; a digital noise-shaping coder, coupled to the register, for shaping the quantization noise of the masked-out bits; and an accumulator, coupled to the register and the coder, for accumulating the digital signals received from the register and the coder. Likewise, a method of digitally shaping the quantization noise of an N-bit digital signal, N being a positive integer, comprises the steps of: masking selected bits of an N-bit digital signal to produce an M-bit digital signal, M being a positive integer less than N; digitally coding the masked bits of the N-bit digital signal to produce a B-bit digital signal, B being a positive integer less than N-M; and accumulating the M-bit digital signal and the B-bit digital signal.

BRIEF DESCRIPTION OF THE DRAWINGS

The subject matter regarded as the invention is particularly pointed out and distinctly claimed in the concluding portion of the specification. The invention, however, both as to organization and method of operation, together with the objects and advantages thereof, may best be understood by reference to the following detailed description when read with the accompanying drawings in which:

In FIG. 5 a 10-bit quantizer was used; in FIG. 6, a 3-bit quantizer.

DETAILED DESCRIPTION

Figure 1:
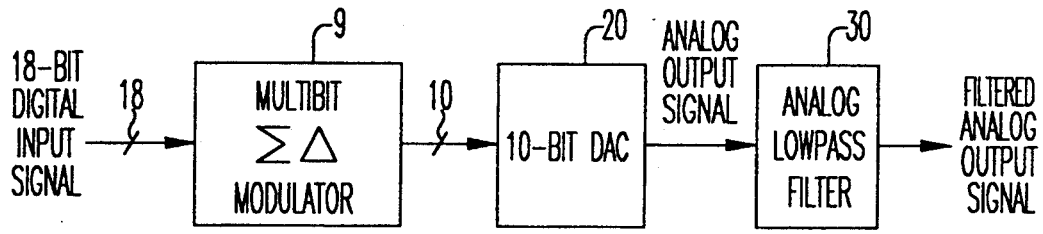
FIG. 1 is a block diagram of a multibit sigma-delta modulator coupled to a conventional digital-to-analog converter.
Figure 2:
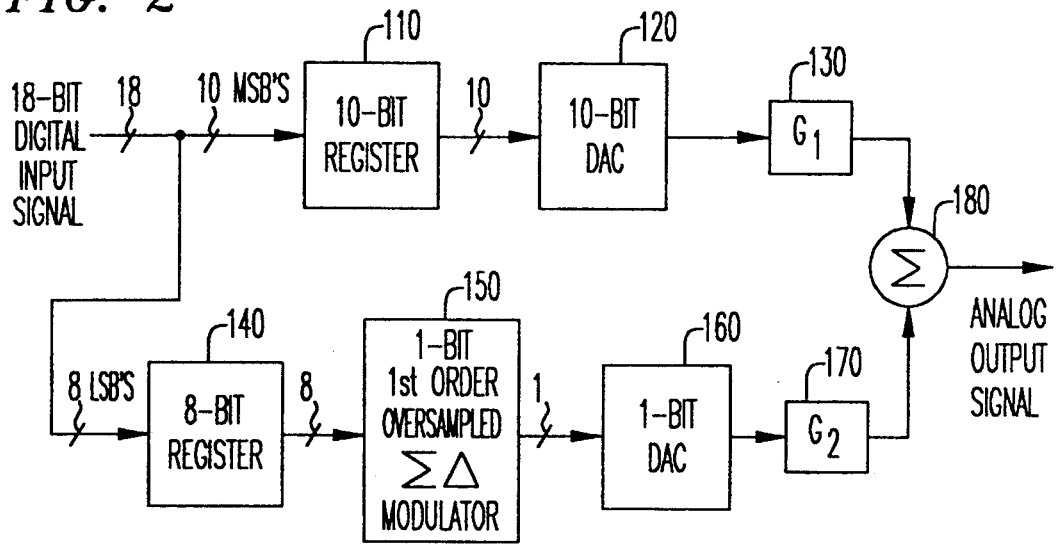
FIG. 2 is a block diagram of a digital-to-analog converter that employs a 1-bit first-order oversampled sigma-delta modulator.

FIG. 1 is a block diagram of one possible embodiment of a digital-to-analog converter, such as one of the type illustrated in the aforementioned Candy and Kenney paper. As illustrated in FIG. 1, an 18-bit digital input signal is provided to a multibit sigma-delta modulator 9. It will, of course, be appreciated that the number of bits selected for the digital signals in FIGS. 1 and 2 is merely illustrative. Due to the noise shaping of the sigma-delta modulator, a 10-bit digital output signal is produced by the modulator and provided to a 10-bit conventional digital-to-analog converter (DAC) 20. The analog output signal produced by DAC 20 is then provided to an analog lowpass filter 30, resulting in the filtered analog output signal. Such a digital-to-analog converter provides some advantages in that at least some of the engineering design constraints on the lowpass analog filter are relaxed, at least in part, because the sigma-delta modulator is multibit rather than 1-bit. Nonetheless, disadvantages of the approach illustrated in FIG. 1 include the problems associated with the use of a multibit sigma-delta modulator, such as, for example, the difficulty of achieving precise linear quantization level conversion with a conventional DAC. Furthermore, all 18 bits of the digital signal must be processed in this architecture. As previously suggested, this approach introduces additional hardware complexity for the sigma-delta modulator.

FIG. 2 is a block diagram of an alterative embodiment of a digital-to-analog converter, this embodiment employing a 1-bit first-order oversampled sigma-delta modulator 150. The architecture illustrated in FIG. 2 corresponds to the aforementioned Burr-Brown PCM67 D/A Converter Chip. As illustrated, an 18-bit digital input signal is provided to the chip. The digital input signal is truncated in that the ten most significant bits are provided to register 110 and the 8 least significant bits are provided to register 140. Likewise, the 10 most significant bits are then provided from register 110 to a 10-bit DAC, which then provides an analog output signal. In a parallel signal path, the 8 least significant bits are provided to 1-bit first-order oversampled sigma-delta modulator 150. A 1-bit digital output signal is provided by the sigma-delta modulator to a 1-bit DAC, which also produces an analog output signal. As illustrated in FIG. 2, analog gains G1 and G2 are calibrated or adjusted to be made equal so that the analog output signal produced by DAC 120 and the analog output signal produced by DAC 160 may be summed or superpositioned at node 180 to produce the total analog output signal of the digital-to-analog converter chip. Typically the gains G1 and G2 are adjusted or calibrated by laser trimming resistive elements on the chip.

This approach, although avoiding the use of a conventional multibit sigma-delta modulator, has other disadvantages, as previously suggested. In particular, precise matching of gains G1 and G2 is particularly crucial and limits the accuracy of the analog output signal produced by the converter chip. Likewise, other analog device anomalies may result in imperfect cancellation of the truncation error associated with truncating the 18-bit digital input signal to produce the 10-bit digital signal for DAC 120. These include thermal noise, slew rate limiting, and other anomalies. Furtherefore, due to the presence of the 1-bit first-order sigma-delta modulator in the parallel signal path, the truncation error may overload the 1-bit quantizer of sigma-delta modulator 150, resulting in nonlinearities that may also degrade the noise floor of the digital output signal produced. This overload problem is even more likely for a higher-order sigma-delta modulator.

Figure 3:
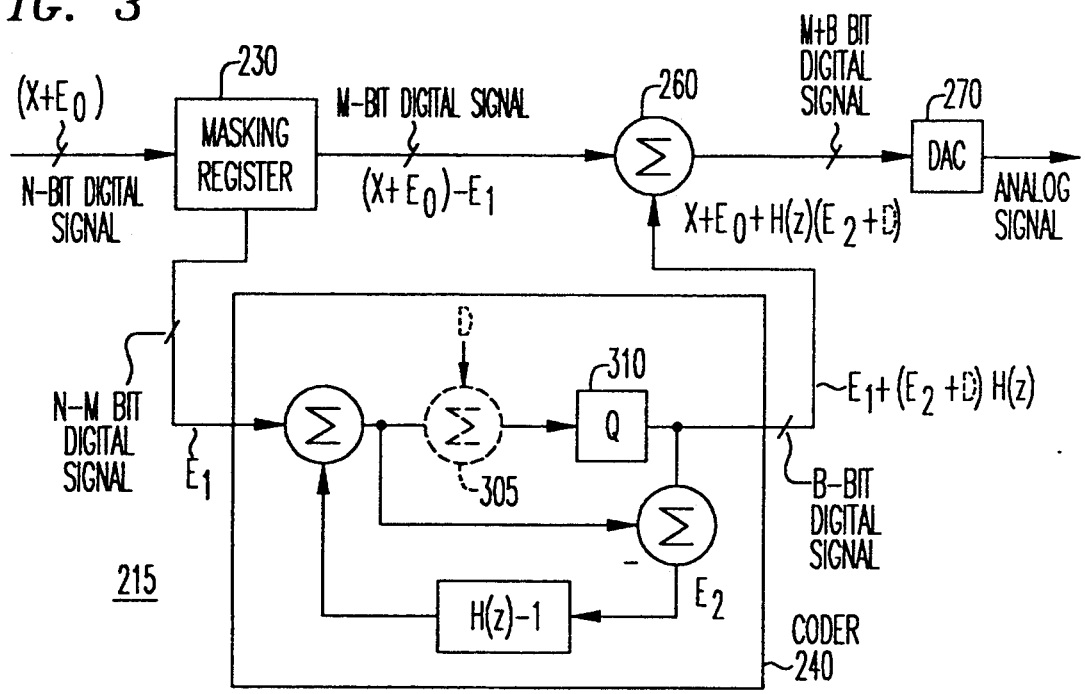
FIG. 3 is a block diagram of one embodiment of a device for digitally shaping the quantization noise of an N-bit digital signal in accordance with the invention, such as may be used in digital-to-analog conversion.

FIG. 3 is a block diagram of one embodiment of a device for digitally shaping the quantization noise of an N-bit digital signal in accordance with the invention. As illustrated, an N-bit digital signal, N being a positive integer, is provided to register 230. It will be understood that, in this context, digital signals designated by upper case letters, such as $X+E_o$ in FIG. 3, represent the Z-transformed version of a corresponding time or sampled data domain signal, typically designated by corresponding lower case letters, such as $x(n)+e_o(n)$, where n is an arbitrary signal index. Register 230 masks N-M selected bits of the N-bit digital signal to provide an M-bit digital signal, M being a positive integer less than N. In the context of the invention, the term masking selected bits of an N-bit digital signal refers to a process in which selected bits are removed from or "masked out" of the N-bit digital signal. This may be accomplished, for example, by a logical AND operation between the selected bits, i.e., the digital binary signals in the selected bit locations of the N-bit digital signal, and zero. Depending on the particular embodiment, masking register 230 may operate as a truncator that truncates the N-M selected bits of the N-bit digital signal. Thus, in this particular embodiment, the N-M selected bits are the N-M least significant bits of the N-bit digital signal. Where register 230 truncates the N-M least significant bits of the N-bit digital signal, a truncation error, designated $E_1$ in FIG. 3, is introduced into the N-bit digital signal produced by register 230. Thus, as illustrated in FIG. 3, where $X+E_o$ represents the N-bit digital signal, including its error $E_o$, provided to register 230, and $X+E_o-E_1$ represents the M-bit digital signal produced by register 230.

The N-M masked bits are then provided to a digital noise-shaping coder 240. Thus, the truncation error $E_1$, corresponding to the N-M least significant bits of the N-bit digital signal, is now provided to digital noise-shaping coder 240. It will be understood that although FIG. 3 illustrates a particular embodiment of a digital noise-shaping coder, the invention is not restricted in scope to this particular embodiment, which is provided only for purposes of illustration. Thus, for example, the digital noise-shaping coder may comprise, without limitation, a sigma-delta modulator, such as one of the type illustrated in FIG. 4. Likewise, the digital noise-shaping coder may comprise a coder of any number of bits, such as a one-bit coder or a multi-bit coder. Likewise, the digital noise-shaping coder may have any order filter in its feedback path, its feed forward path, or both, and, in addition, it may have multiple feed forward loops, multiple feedback loops, or both. Furthermore, the digital noise-shaping coder may be multi-staged or cascaded. Thus, in general, depending on the particular application, any digital noise-shaping coder will suffice in which at least a portion of the in-band quantization noise of the coder is reduced at the expense of a portion of the out-of-band quantization noise. Moreover, in the context of the invention, digitally shaping the quantization noise refers to a process whereby the power spectral density associated with the quantization error is shaped by digital filtering so that at least a portion of the amount of noise energy present over a predetermined range of relevant frequencies is reduced.

As illustrated by digital noise-shaping coder 240 of FIG. 3, the N-M bit digital signal may be superpositioned with a digitally filtered error signal, filtered by a digital noise-shaping filter $H(z)-1$, and then "requantized" by quantizer 310. This "requantized" digital signal is compared with the superpositioned digital signal before "requantization" to produce the "requantization" error signal, designated $E_2$ in FIG. 3. This "requantization" error signal, $E_2$, is the error signal mentioned above, filtered by the digital noise-shaping filter, $H(z)-1$, and summed or superpositioned with the N-M bit digital signal provided by register 230. Digital noise-shaping filters are described in more detail in the aforementioned "Oversampling Methods for A/D and D/A Conversion" and "Oversampled, Linear Predictive and Noise-Shaping Coders of Order $N>1$." As illustrated, the result of this digital signal processing is to produce a B-bit digital signal, B being a positive integer less than N-M, that may be summed or superpositioned with the M-bit digital signal at node or accumulator 260 to provide an M+B bit digital signal, M+B being a positive integer less than N. It may be desirable for the digital signal produced by the digital noise-shaping coder to be represented as either a positive or negative signal. When this approach is employed, one of the bits at the B bit digital signal functions as a sign bit, and the digital signal produced at accumulator 260 may therefore comprise M+B−1 bits rather than M+B bits. By this technique of representing positive and negative signals in the coder, overloading of the quantizer may be avoided.

The result of embodiment 200 is to requantize digital signal $X+E_o$ into another digital signal having fewer bits, for further signal processing. Furthermore, the quantization, or requantization, noise introduced by this process has been digitally shaped so that it is negligible in comparison with the noise, $E_o$, of the initial signal $E_o$. Likewise, as illustrated in FIG. 3, this quantized digital signal may be provided to a conventional digital-to-analog converter 270 to produce an analog output signal. Nonetheless, due to the digital shaping of the quantization noise accomplished, the hardware complexity of DAC 270 is reduced, at least in part, because the digital signal provided to the DAC has fewer bits than the initial digital signal. Thus, as illustrated, embodiment 200 of a device for shaping the quantization noise of an N-bit digital signal in accordance with the invention may also be employed in a device for converting an N-bit digital signal to an analog signal to achieve some advantages over conventional digital-to-analog conversion approaches.

Although in the embodiment of FIG. 3, the N-M least significant bits of the N-bit digital signal are masked by register 230, the invention is not so limited in scope. For example, a field of bits in the N-bit digital signal, other than the least significant bits, may be masked. In the context of the invention, this is referred to as "digital signal bit field ranging." Likewise, non-contiguous bits may be masked, depending on the particular application. Furthermore, quantizer 310 illustrated in FIG. 3 may comprise either a 1-bit quantizer or a multibit quantizer. One advantage of employing a 1-bit quantizer is the inherent linearity associated with only employing two digital signal output levels, particularly for small input signals where a substantial amount of the signal energy passes through the digital noise-shaping coder. Nonetheless, other advantages may result from the use of a multibit quantizer as well. For example, if a 2 or 3-bit quantizer is employed, overload due to the truncation error provided to the digital noise-shaping coder may be avoided. Furthermore, as previously suggested, the architecture illustrated in FIG. 3 offers advantages in comparison with the approach in FIG. 1 in that fewer conversion levels for the DAC are required, thereby reducing the linearity problem presented.

An advantage offered by the architecture illustrated in FIG. 3 in comparison with the architecture illustrated in FIG. 2 includes exact cancellation of the truncation error. The truncation error is introduced when the N-bit digital signal is converted to an M-bit digital signal, the M bits being the most significant bits of the N-bit digital signal in this particular embodiment. Exact cancellation or correction, however, occurs because the summation or superposition of the two digital signals at accumulator 260 in FIG. 3 is performed in the digital domain, as opposed to the analog domain as illustrated in FIG. 2. Furthermore, by having only one DAC, the problem of analog mismatches between two different DACs, such as DAC 120 and DAC 160 in FIG. 2, is avoided.

Figure 4:
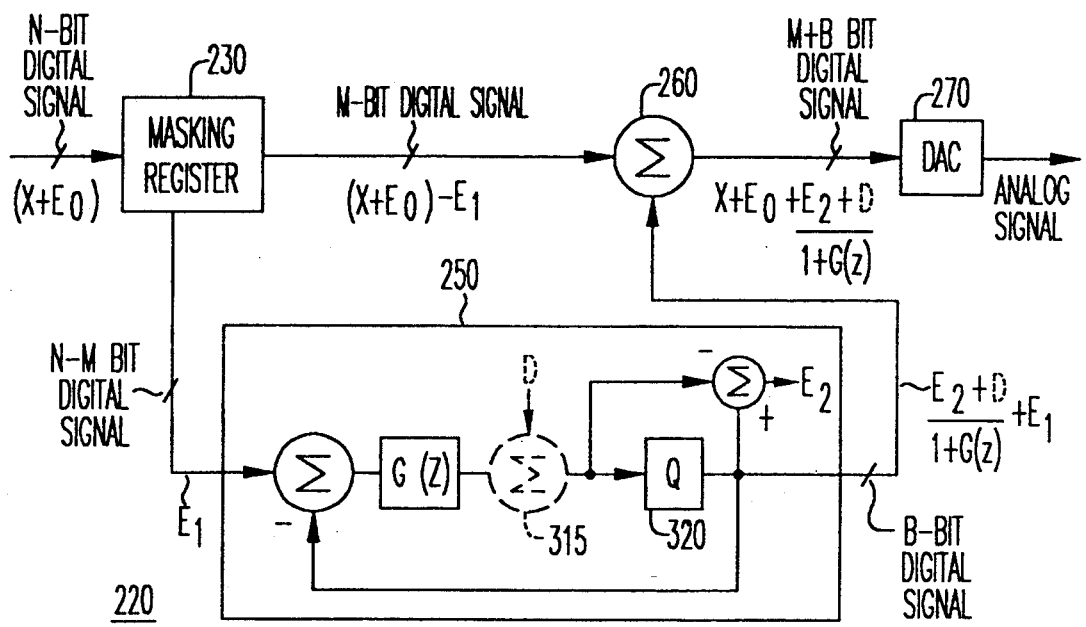
FIG. 4 is a block diagram of another embodiment of a device for digitally shaping the quantization noise of an N-bit digital signal in accordance with the invention, such as may be used in digital-to-analog conversion.

Other advantages may be achieved by using a sigma-delta modulator, such as modulator 250 in FIG. 4, in place of digital noise-shaping coder 240. Nonetheless, as previously discussed, the invention is not restricted in scope to the particular embodiments of a digital noise-shaping coder or sigma-delta modulator illustrated. In contrast with the previously-described digital noise-shaping coder and as explained in more detail in the aforementioned "Oversampled, Linear Predictive and Noise-Shaping Coders of Order $N>1$," in FIG. 4 the N-M bits of the N-bit digital signal corresponding to truncation error $E_1$ are offset with the digital output signal of the sigma-delta modulator. As illustrated, the digital output signal of sigma-delta modulator 250 is the requantized, digitally-filtered, N-M bits offset by the digital signal output of the sigma-delta modulator. Again, the quantizer, such as quantizer 320 in FIG. 4, may be either 1-bit or multibit. When a multibit quantizer is employed, the sigma-delta modulator may be designed to an arbitrarily high order of noise shaping and still remain stable. This provides an advantage in that a reduction of the oversampling ratio, for an oversampled sigma-delta modulator, may be employed, thereby improving the usable speed and bandwidth of digital-to-analog converter 270 without a degradation in the signal-to-noise ratio in the baseband. Alternatively, as previously discussed with respect to FIG. 3, a DAC of reduced hardware complexity may be employed. It will, of course, be appreciated that if an oversampled sigma-delta modulator is employed, the digital-to-analog conversion system illustrated in FIG. 4 comprises the system after interpolation from a lower sampling rate has taken place. Thus, the digital signal provided to register 230 is already oversampled.

FIGS. 3 and 4 illustrate yet other embodiments of a device for shaping the quantization noise of an N-bit digital signal in accordance with the invention. In these figures, high-level dither, such as described in U.S. Pat. No. 5,144,308, entitled "Idle Channel Tone and Periodic Noise Suppression for Sigma-Delta Modulators using High Level Dither," by Norsworthy, issued Sep. 1, 1992, assigned to the assignee of the present invention and herein incorporated by reference, is illustrated in phantom. In FIGS. 3 and 4, D represents the Z-transformed version of a time or sampled data domain dither signal, d(n). As illustrated in FIGS. 3 and 4 in phantom, dithering may be accomplished by superpositioning or adding a dither signal, typically white noise, such as may be produced by a dither signal generator, to the digital signal of the sigma-delta modulator, illustrated in FIG. 4, or the digital noise-shaping coder, illustrated in FIG. 3, before the quantizer quantizes the digital signal. In the context of the invention, a sigma-delta modulator that also performs dithering, such as illustrated in FIG. 4, is referred to as a dithered sigma-delta modulator.

A device for digitally shaping the quantization noise of an N-bit digital signal, such as illustrated in FIG. 3, may operate in accordance with the following method. An N-bit digital signal is provided to masking register 230. Selected bits of the N-bit digital signal are masked to produce an M-bit digital signal, M being a positive integer less than N. In FIG. 3, as previously discussed, the N-bit digital signal is truncated. The N-M masked or truncated bits of the N-bit digital signal are digitally coded, in the embodiment illustrated in FIG. 3 the N-M least significant bits, to provide a B-bit digital signal, B being a positive integer less than N-M. As previously discussed, many different digital noise-shaping coders other than the embodiment illustrated in FIG. 3 may be employed to accomplish this step. The M-bit digital signal produced from the N-bit digital signal and the B-bit digital signal produced from the N-M bit digital signal are then accumulated by accumulator or summing note 260. Furthermore, a conventional digital-to-analog converter, such as DAC 270, may convert the accumulated digital signal to an analog signal. As illustrated in FIG. 4, digitally coding the masked N-M bits of the N-bit digital signal, may comprise sigma-delta modulating the N-M bits. As further illustrated in phantom in FIGS. 3 and 4, dithering may also be included. For example, where the step of sigma-delta modulating the remaining bits of the N-bit digital signal other than the M-bits includes quantizing a digitally-filtered signal, such as illustrated in FIG. 3, the step of sigma-delta modulating the remaining or masked N-M bits comprises superpositioning a dither signal, as previously discussed, with the digitally-filtered signal and quantizing, or "requantizing," the superpositioned digital signal.

Figure 5:
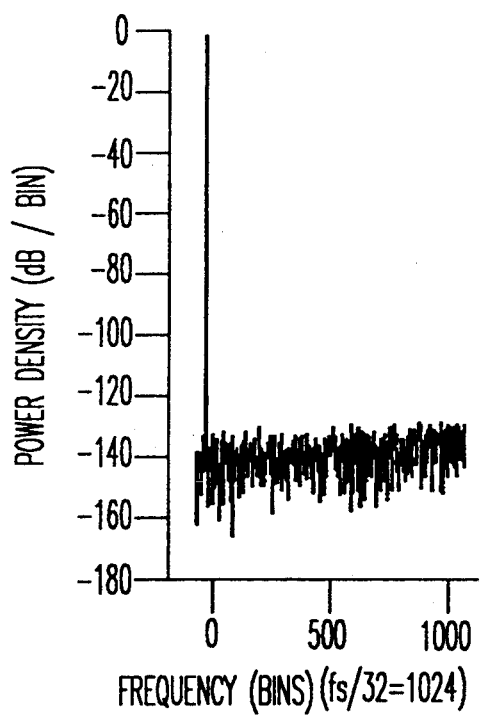
FIGS. 5 and 6 are, respectively, plots of simulation results illustrating the performance of a multibit oversampled sigma-delta modulator and the performance of a device for digitally shaping the quantization noise of an N-bit digital signal in accordance with the invention having the architecture of the embodiment illustrated in FIG. 4.
Figure 6:
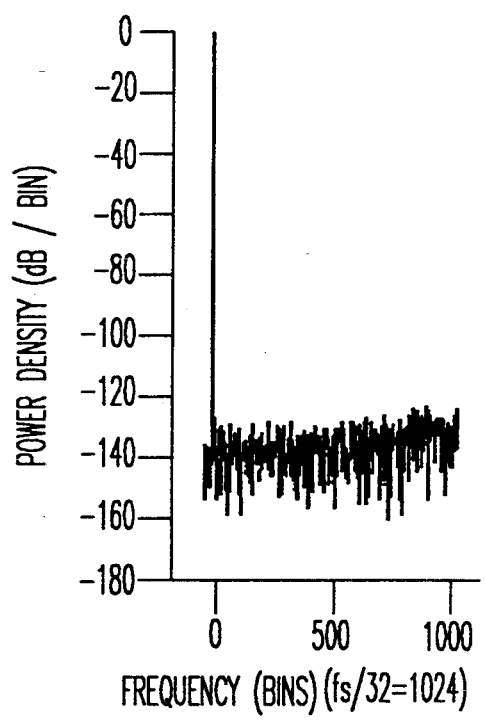

FIGS. 5 and 6 are, respectively, plots of simulation results illustrating the performance of a multibit sigma-delta modulator, such as illustrated in FIG. 1, with a device for digitally shaping the quantization noise of an N-bit digital signal in accordance with the invention having the architecture of the embodiment illustrated in FIG. 4. To obtain these results, a 16-bit sine wave was provided to a second-order multibit digital sigma-delta modulator. The quantizer of the modulator was 10 bits. The output signal of the quantizer was then provided an "ideal" 10-bit DAC. In this simulation, the oversampling ratio employed was 16. This produced a baseband noise floor of $-105.1$ dB. The spectrum produced is illustrated in FIG. 5, where $f_s$ is the oversampling frequency and 1024 "bins" of data are plotted. Next for direct comparison, the 16-bit sine wave described above was truncated to 8-bits. The 8 least significant bits were provided to a second-order sigma-delta modulator having only a 3-bit quantizer, instead of the former 10-bit quantizer. The output signal of the quantizer was superpositioned with the 8 most significant bits of the initial 16-bit signal, producing a 10-bit output signal. This was also fed to an "ideal" 10-bit DAC. As before, the oversampling ratio employed was 16, in this case producing a baseband noise floor of $-104.4$ dB. The spectrum produced is illustrated in FIG. 6. As the respective spectra and the respective noise floors indicate, the digital noise shaping employed to produce FIG. 6 introduced some slight additional error into the resulting signal, however, this error is negligible in comparison with the initial baseband noise floor. Thus, a reduction in the complexity of the hardware, in this case a reduction from a 16-bit digital signal path to an 8-bit digital signal path for the sigma-delta modulator, was achieved without a substantial degradation in the quality of the digital signal obtained.

While only certain features of the invention have been illustrated and described herein, many modifications, substitutions, changes or equivalents will now occur to these skilled in the art. It is, therefore, to be understood that the appended claims are intended to cover all such modifications and changes as fall within the true spirit of the invention.

We claim:

1. A device for digitally shaping the quantization noise of an N-bit digital signal, N being positive integer, said device comprising:
   a register for masking out selected bits of the N-bit digital signal to produce an M-bit digital signal, M being a positive integer less than N;
   a digital noise-shaping coder, coupled to said register, for shaping the quantization noise of the masked out bits to produce a B-bit digital signal, B being a positive integer less than N-M; and
   an accumulator, coupled to said register and said coder, for accumulating the digital signals received from said register and said coder.

2. The device of claim 1, wherein said register comprises a truncator; and
   wherein the masked out bits comprise the N-M least significant bits of the N-bit digital signal.

3. The device of claim 2, wherein said coder comprises a digital noise-shaping coder selected from the group consisting essentially of a multibit digital noise-shaping coder and a one-bit digital noise-shaping coder.

4. The device of claim 1, wherein said coder comprises a sigma-delta modulator.

5. The device of claim 4, wherein said sigma-delta modulator comprises an oversampled sigma-delta modulator.

6. The device of claim 4, wherein said sigma-delta modulator comprises a multibit dithered sigma-delta modulator.

7. The device of claim 4, wherein said sigma-delta modulator comprises a sigma-delta modulator selected from the group consisting essentially of a one-bit sigma-delta modulator and a multibit sigma-delta modulator.

8. The device of claim 1, and further comprising:

a digital-to-analog converter, coupled to said accumulator, for convening the digital signal received from said accumulator to an analog signal.

9. A method of digitally shaping the quantization noise of an N-bit digital signal, N being a positive integer, said method comprising the steps of:

masking selected bits of the N-bit digital signal to produce an M-bit digital signal, M being a positive integer less than N;

digitally coding the masked bits of the N-bit signal to provide a B-bit digital signal, B being a positive integer less than N-M; and accumulating the M-bit digital signal and the B-bit digital signal.

10. The method of claim 9, wherein the B-bit digital signal comprises a digital signal selected from the group consisting essentially of a multibit digital signal and a one-bit digital signal.

11. The method of claim 9, wherein the step of masking comprises truncating the N-bit digital signal to produce the M-bit digital signal; and wherein the M-bit digital signal comprises the M most significant bits of the N-bit digital signal.

12. The method of claim 11, wherein the step of digitally coding the masked bits comprises sigma-delta modulating the masked bits.

13. The method of claim 12, wherein the step of sigma-delta modulating the masked bits of the N-bit digital signal includes oversampling the masked bits.

14. The method of claim 12, wherein the step of sigma-delta modulating the masked bits includes quantizing a digitally filtered signal produced, at least in part, from the masked bits of the N-bit digital signal to thereby produce a multibit signal;

the step of sigma-delta modulating the masked bits including, before quantizing:

superpositioning a dither signal with the digitally filtered signal; and quantizing the superpositioned signal including the digitally filtered signal.

15. The method of claim 9, and further comprising the step of converting the accumulated digital signal to an analog signal.

16. The device of claim 3, wherein said coder comprises a multibit digital noise shaping coder.

17. The device of claim 7, wherein said sigma-delta modulator comprises a multibit sigma-delta modulator.

18. The method of claim 10, wherein the B-bit digital signal comprises a multibit digital signal.

* * * * *